United States Patent
Lei et al.

(10) Patent No.: US 11,668,762 B2
(45) Date of Patent: Jun. 6, 2023

(54) LEAKAGE CURRENT DETECTION CIRCUIT, METHOD AND LEAKAGE CURRENT DETECTOR

(71) Applicant: SHENZHEN POWEROAK NEWENER CO., LTD, Shenzhen (CN)

(72) Inventors: Jianhua Lei, Shenzhen (CN); Yongbo Zhang, Shenzhen (CN); Hui Ma, Shenzhen (CN); Geng Qin, Shenzhen (CN)

(73) Assignee: SHENZHEN POWEROAK NEWENER CO., LTD, Shenzhen (CN)

( * ) Notice: Subject to any disclaimer, the term of this patent is extended or adjusted under 35 U.S.C. 154(b) by 0 days.

(21) Appl. No.: 17/944,396

(22) Filed: Sep. 14, 2022

(65) Prior Publication Data

US 2023/0141539 A1    May 11, 2023

Related U.S. Application Data

(63) Continuation of application No. PCT/CN2022/081474, filed on Mar. 17, 2022.

(30) Foreign Application Priority Data

Nov. 8, 2021   (CN) .......................... 202111312286.3

(51) Int. Cl.
*G01R 31/52*  (2020.01)
(52) U.S. Cl.
CPC .................................. *G01R 31/52* (2020.01)

(58) Field of Classification Search
CPC ....................................................... G01R 31/52
See application file for complete search history.

(56) References Cited

U.S. PATENT DOCUMENTS

| 4,228,475 A | * | 10/1980 | Sherwood | .............. | G01R 31/52 |
| | | | | | 324/510 |
| 4,371,832 A | * | 2/1983 | Wilson | .................. | H02H 3/332 |
| | | | | | 324/509 |

(Continued)

FOREIGN PATENT DOCUMENTS

| CN | 101949965 A | * | 1/2011 | .......... G01R 15/185 |
| CN | 102680851 A | | 9/2012 | |

(Continued)

*Primary Examiner* — Patrick Assouad
*Assistant Examiner* — Demetrius R Pretlow
(74) *Attorney, Agent, or Firm* — IPro, PLLC

(57) ABSTRACT

A leakage current detection circuit is used for detecting a leakage current, includes a main winding, an auxiliary winding, a detection module and a signal output module used for outputting a pulse signal with pulse signals with positive and negative alternations, wherein the main winding is connected to a leakage current detection end and coupled to the auxiliary winding, and the auxiliary winding is respectively connected to the signal output module and the detection module. During the auxiliary winding in a preset state and a leckage current occurred, the leakage current coupled to the auxiliary winding is superimposed with the pulse signal, so that the current signal detected by the detection module is greater than the current signal detected when the pulse signal with pulse signals with positive and negative alternations is not applied.

13 Claims, 7 Drawing Sheets

(56) References Cited

U.S. PATENT DOCUMENTS

| | | | |
|---|---|---|---|
| 2011/0006779 A1* | 1/2011 | Kobayashi | G01R 33/04 324/537 |
| 2014/0254050 A1* | 9/2014 | Haines | H02H 3/16 361/42 |
| 2017/0328933 A1* | 11/2017 | Mori | G01R 31/52 |

FOREIGN PATENT DOCUMENTS

| | | | | |
|---|---|---|---|---|
| CN | 208421051 U | * | 1/2019 | |
| CN | 112763938 A | * | 5/2021 | G01R 31/52 |
| CN | 113406531 A | * | 9/2021 | G01R 19/00 |

\* cited by examiner

LEAKAGE CURRENT DETECTION CIRCUIT, METHOD AND LEAKAGE CURRENT DETECTOR

PRIORITY CLAIM

This application claims the benefit of and priority to Chinese Patent Application No. 202111312286.3, filed to the China Patent Office on Nov. 8, 2021 and entitled "Leakage Current Detection Circuit, Method and Leakage Current Detector" which is hereby incorporated by reference in its entirety.

TECHNICAL FIELD

The present application relates to the technical field of inverter leakage current detection, for example, relates to a leakage current detection circuit, a method and a leakage current detector.

BACKGROUND

In a photovoltaic or optical storage grid-connected inverter, if the contact current between each terminal of the photovoltaic module array and ground is greater than 30 mA, the power conversion equipment (such as an inverter) needs to have a residual current (leakage current) detection or monitoring protection function.

In the prior art, a square wave voltage of a specific frequency generated by a circuit is applied under a secondary winding of a current transformer, and when there is an unbalanced current (i.e. a leakage current) at an alternating current output of a transformer, the leakage current is induced and superimposed on the secondary winding, so as to be recognized by a detection circuit. Detecting the leakage current as above causes problems of low sensitivity and high cost in detecting the leakage current.

SUMMARY

One technical solution adopted by the embodiments of the present application is to discloses a leakage current detection circuit, wherein the leakage current detection circuit includes a main winding, an auxiliary winding, a detection module and a signal output module.

wherein the main winding is used for being connected to a leakage current detection end of the device to be detected, the main winding is coupled to the auxiliary winding, and the auxiliary winding is respectively connected to the signal output module and the detection module;

the signal output module is used for outputting pulse signals with positive and negative alternations so that the auxiliary winding is in a preset state; and the detection module is used for detecting a current signal of the auxiliary winding which is in the preset state, and detecting a leakage current of the device to be detected according to the current signal.

Optionally, the signal output module includes a first switch tube, a second switch tube, a third switch tube, a fourth switch tube and a first control unit.

A first end of the first switch tube and a first end of the second switch tube are used for connecting a power supply, a second end of the first switch tube is connected to a first end of the auxiliary winding via the detection module, a second end of the first switch tube is also connected to a first end of the fourth switch tube, a second end of the second switch tube is respectively connected to a second end of the auxiliary winding and a first end of the third switch tube, a second end of the third switch tube and a second end of the fourth switch tube are used for grounding, and the first control unit is respectively connected to control ends of the first switch tube, the second switch tube, the third switch tube and the fourth switch tube; and The first control unit is used for controlling the on-off states of the first switch tube, the second switch tube, the third switch tube and the fourth switch tube so as to output the pulse signals with positive and negative alternations, wherein the on-off state of the first switch tube is the same as that of the third switch tube, the on-off state of the second switch tube is the same as that of the fourth switch tube, and the first switch tube and the second switch tube are alternately conductive.

Optionally, the detection module includes a sampled resistor, an operational amplifier and a second control unit.

A first end of the auxiliary winding is connected to the signal output module via the sampled resistor, two input ends of the operational amplifier are connected to two ends of the sampled resistor, and an output end of the operational amplifier is connected to the second control unit.

Optionally, the detection module is further used for acquiring leakage current information according to the current signal and the duty ratio of the pulse signal, so that the leakage current of the device to be detected is detected.

Alternatively, the detection module is also used for determining whether the current signal is greater than a preset current, and in response to the current signal greater than the preset current, outputting a leakage current alarm signal.

Another technical solution adopted by the embodiments of the present application is to discloses a leakage current detection method applied to the leakage current detection circuit in any of the above embodiments. The method includes: inputting pulse signals with positive and negative alternations to the auxiliary winding so that the auxiliary winding is in a preset state;

detecting a current signal of the auxiliary winding which is in the preset state; and detecting a leakage current of the device to be detected according to the current signal.

Optionally, the step of inputting the pulse signals with positive and negative alternations to the auxiliary winding so that the auxiliary winding is in a preset state includes:

acquiring parameter information about the auxiliary winding, wherein the parameter information includes a cross-sectional area of a magnetic core of the auxiliary winding and the number of coil turns;

acquiring a magnetic induction intensity variation of the auxiliary winding which is in a near saturation state;

calculating a first duty ratio of the pulse signal according to the parameter information and the magnetic induction intensity variation amount; and inputting the pulse signals with positive and negative alternations to the auxiliary winding so that the auxiliary winding is in the preset state, wherein the size of the duty ratio of the pulse signal is the calculated first duty ratio.

Optionally, the method further includes:

detecting whether the current signal is greater than a preset threshold value;

in response to the current signal greater than the preset threshold value, acquiring direction information about the current signal;

reversely adjusting the size of the duty ratio of the pulse signal according to the direction information and reacquiring a current signal of the auxiliary winding; and obtaining the leakage current information according to the reacquired current signal and adjusted size of the duty ratio, so that the leakage current of the device to be detected is detected.

Optionally, the step of adjusting the size of the duty ratio of the pulse signal in a reverse direction according to the direction information includes:

in response to the current signal detected to be positive, reducing the duty ratio of the positive pulse signal, and keeping the duty ratio of the negative pulse signal unchanged; and in response to the current signal detected to be negative, reducing the duty ratio of the negative going pulse signal, and keeping the duty ratio of the positive pulse signal unchanged.

Optionally, the method further includes:

in response to the current signal detected to be greater than a first preset threshold value and less than a second preset threshold value, according to the direction information, reversely adjusting the size of the duty ratio of the pulse signal to a second duty ratio;

in response to the current signal detected to be greater than the second preset threshold value, according to the direction information, reversely adjusting the size of the duty ratio of the pulse signal to a third duty ratio; wherein the first preset threshold value is less than the second preset threshold value, and the second duty ratio is greater than the third duty ratio.

Optionally, after the step of inputting the pulse signals with positive and negative alternations to the auxiliary winding so that the auxiliary winding is in a preset state, the method further includes:

adjusting the magnitude of a positive or negative size of the duty ratio in the pulse signals with positive and negative alternations, so that the size of the duty ratio of the positive pulse signal and the negative pulse signal is different, and detecting a current signal of the auxiliary winding in real time; and self-testing the leakage current detection circuit according to the magnitude of the current signal.

Another technical solution adopted by the embodiments of the present application is to discloses a leakage current detector comprising a leakage current detection circuit as described in any of the embodiments above and/or detecting leakage current using a leakage current detection method as described in any of the embodiments above.

BRIEF DESCRIPTION OF THE DRAWINGS

The one or more embodiments are illustrated by way of example in the accompanying drawings, which are not to be construed as limiting the embodiments, in which elements having the same reference numeral designations represent similar elements, and in which the figures are not to scale unless otherwise specified.

DETAILED DESCRIPTION

In order that the objects, aspects and advantages of the present application may be more clearly understood, a more particular description of the invention, briefly summarized below, may be had by reference to the appended drawings and examples. It should be understood that the particular embodiments described herein are illustrative only and are not restrictive.

It should be noted that, if not in conflict, the various features of the embodiments of the present application may be combined with of the present application. In addition, although the division of functional modules is illustrated in a schematic diagram of an apparatus and a logical order is illustrated in a flowchart, in some cases, the steps illustrated or described may be performed in an order other than the division of the modules in the schematic diagram of the apparatus or in the flowchart.

Unless defined otherwise, all technical and scientific terms used in the specification have the same meaning as commonly understood by a person skilled in the technical field to which this application belongs. The terminology used in the description of the present application is for the purpose of describing particular embodiments only and is not intended to be limiting of the application. As used herein, the term "and/or" includes any and all combinations of one or more of the associated listed items.

Figure 1:
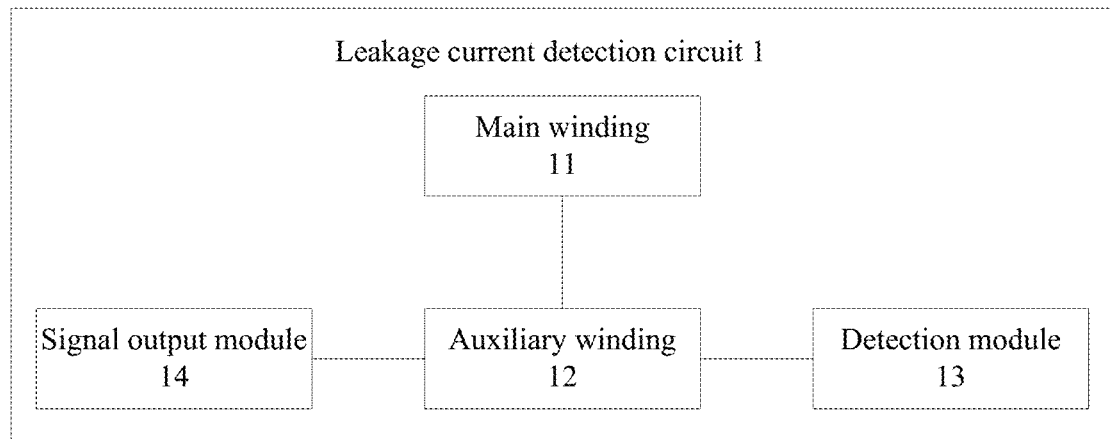
FIG. 1 is a schematic structural diagram of a leakage current detection circuit according to an embodiment of the present application.

With reference to FIG. 1, FIG. 1 is a schematic structural diagram of a leakage current detection circuit according to an embodiment of the present application, wherein the leakage current detection circuit 1 is used for detecting a leakage current of a device to be detected, and the leakage current detection circuit 1 includes a main winding 11, an auxiliary winding 12, a detection module 13 and a signal output module 14.

Wherein the main winding 11 is used for being connected to a leakage current detection end of the device to be detected, the main winding 11 is coupled to the auxiliary winding 12, and the auxiliary winding 12 is respectively connected to the detection module 13 and the signal output module 14.

The signal output module 14 is used for outputting pulse signals with positive and negative alternations so that the auxiliary winding 12 is in a preset state.

The detection module 13 is used for detecting a current signal of the auxiliary winding 12 which is in the preset state, and a leakage current of the device to be detected is detected according to the current signal.

Specifically, the main winding 11 is connected to a leakage current detection end of the device to be detected, for example, a leakage current detection end of a DC-AC module. In some embodiments, the main winding 11 and the auxiliary winding 12 may be inductive components, divided into a common-mode inductance of the main winding 11 and an auxiliary inductance of the auxiliary winding 12, and the common-mode inductance and the auxiliary inductance are coupled, for example via an iron core, to detect a leakage current of the device to be detected.

Specifically, the pulse signals with positive and negative alternations refer to inputting a positive pulse signal in a first time sequence, inputting a negative (reverse) pulse signal in a second time sequence, inputting a positive pulse signal in a third time sequence, and inputting a negative pulse signal in a fourth time sequence, successively circulating and continuously outputting pulse signals, wherein the positive pulse signal and the negative pulse signal have opposite directions, for example, the auxiliary winding 12 has a first end and a second end, inputting the positive pulse signal to the auxiliary winding 12, and the positive pulse signal flowing in from the first end and flowing out from the second end; the negative pulse signal is input to the auxiliary winding 12, the negative pulse signal flows in from the second end and flows out from the first end, wherein the positive pulse signal and the negative pulse signal may be electrical signals. The pulse signals with positive and negative alternations are output through the signal output module 14 so that the auxiliary winding 12 is in the preset state. It should be noted that the preset state may refer to a state in which the auxiliary winding 12 is in near saturation, or a state in which the auxiliary winding 12 is in a magnetic amplification state, alternatively, a state in which the amount of voltage change is maximum when the voltage applied to the auxiliary winding 12 changes.

Figure 2A:
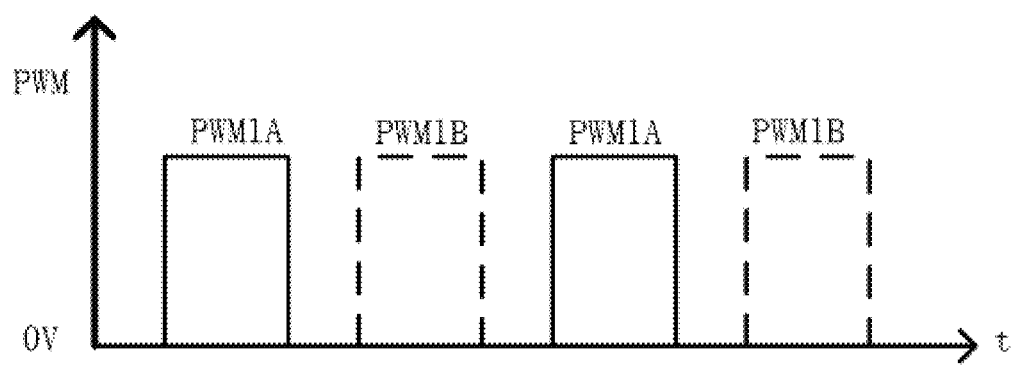
FIGS. 2A-2C are waveform diagrams of undetected leakage currents in a leakage current detection circuit according to an embodiment of the present application.
Figure 2B:
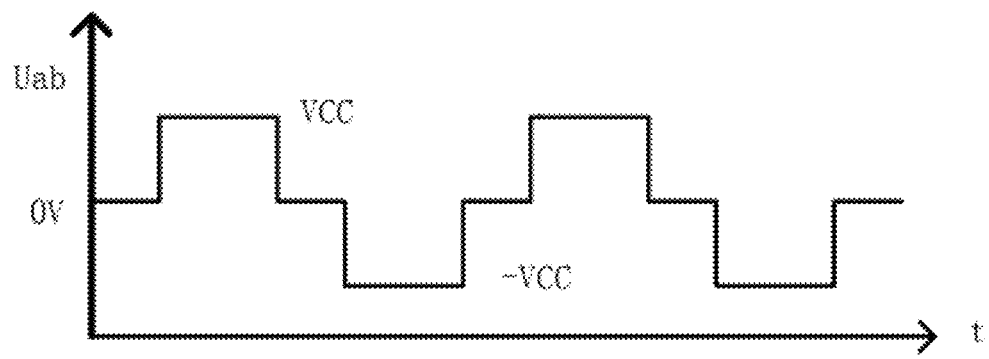
Figure 2C:
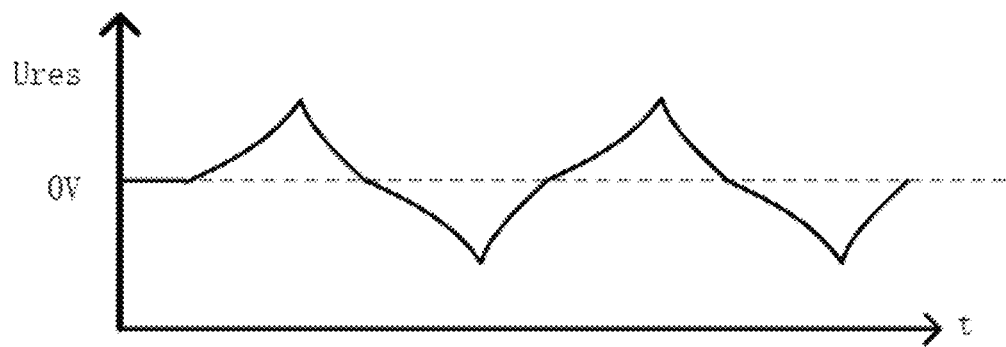

Specifically, as shown in FIGS. 2A-2C, when no leakage current is generated on the main winding 11, the signal output module 14 inputs the pulse signals with positive and negative alternations to the auxiliary winding 12, the detection module 13 detects a current or voltage signal with positive and negative alternations, and the effective value of the positive current is equal to the effective value of the negative current in one period, and at this time, the detection module 13 collects that the effective value of the current in one period is zero. That is, when the detection module 13 detects that the current signal is zero, it is indicated that the device to be detected does not have a leakage current fault.

Figure 3:
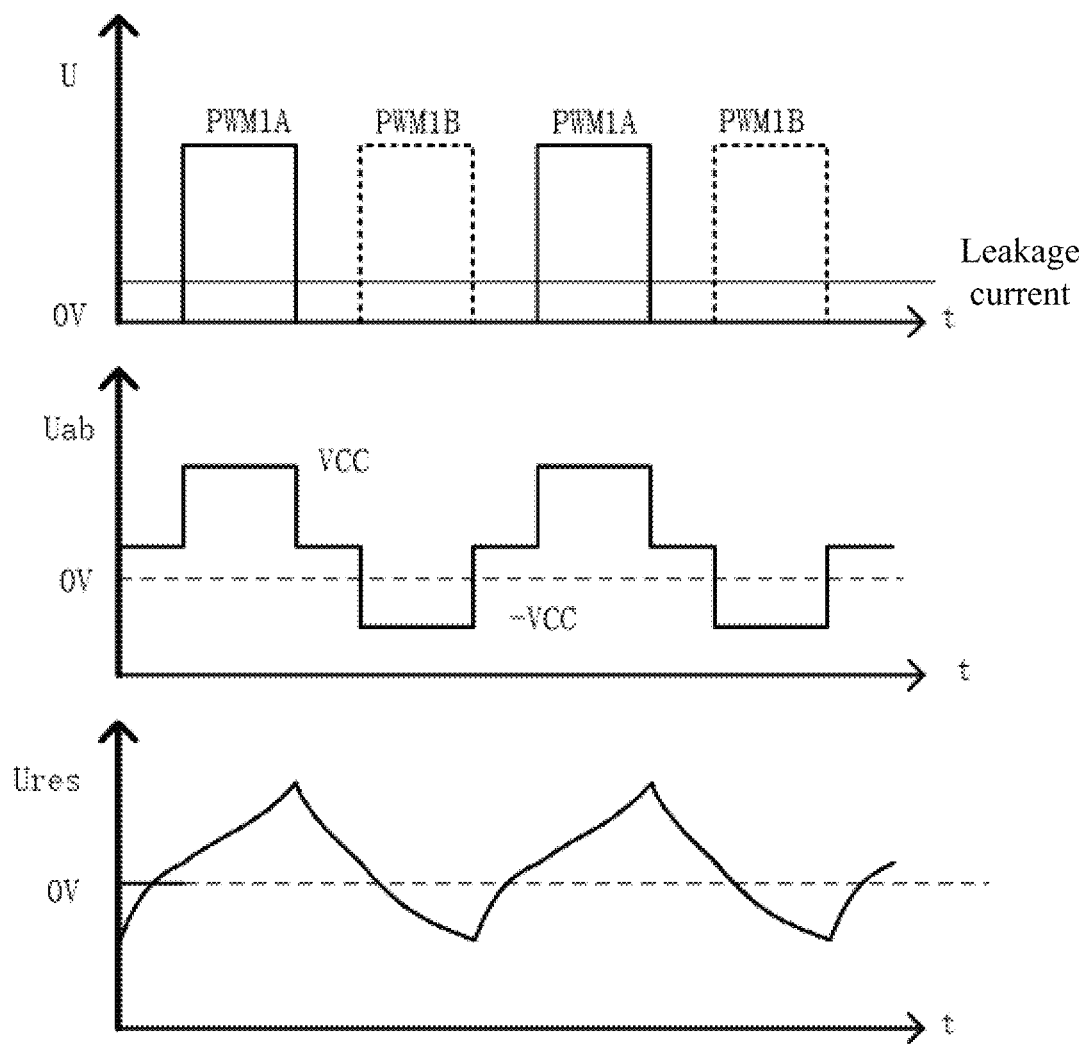
FIG. 3 is a waveform diagram when a leakage current is detected in a leakage current detection circuit according to an embodiment of the present application.

When a leakage current flows through the main winding 11, the auxiliary winding 12 will generate a corresponding induced current, and the generated induced current is superimposed with the pulse signals with positive and negative alternations; current information about the auxiliary winding 12 detected by the detection module 13 will shift to one side; as shown in FIG. 3, when the leakage current is positive, the positive voltage or positive current collected by the detection module 13 increases, the negative voltage or negative current decreases, and the effective value of the detected current or voltage within one period increases, so that the detection of the leakage current can be realized, and the sensitivity of leakage current detection is improved; furthermore, it is not necessary to use a high-cost leakage current sensor, which reduces the cost of leakage current detection.

Figure 4:
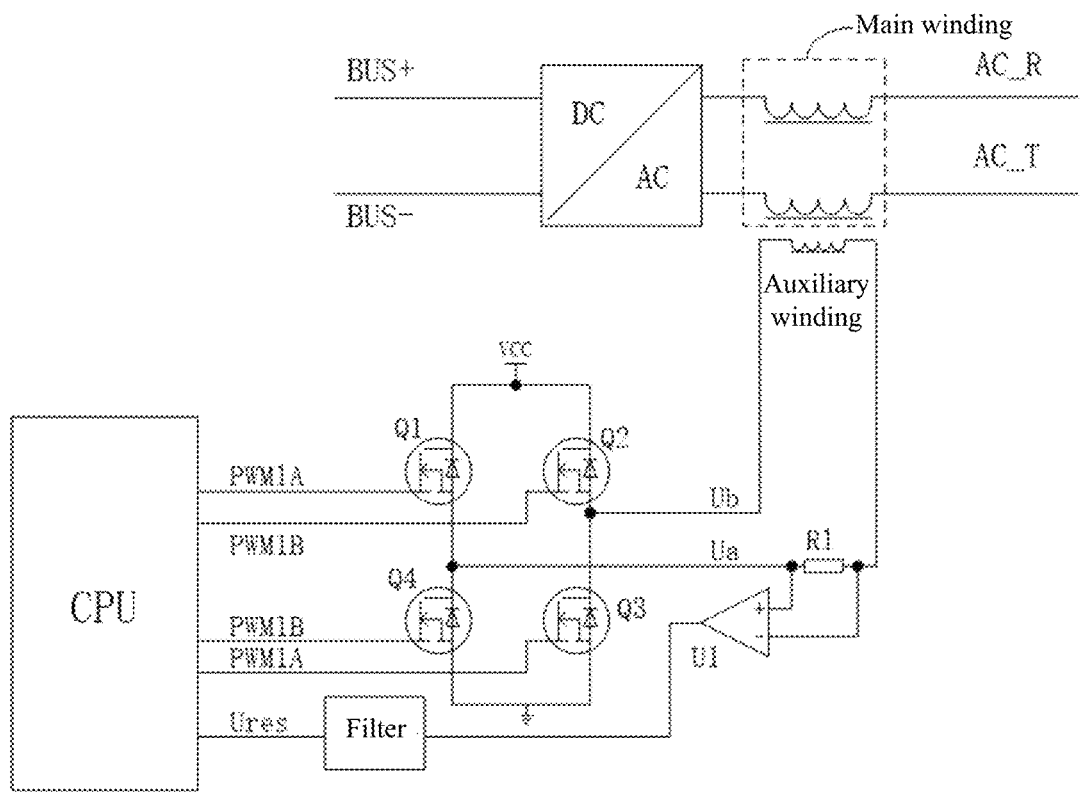
FIG. 4 is a circuit configuration diagram of a leakage current detection circuit according to an embodiment of the present application.

In some embodiments, reference to FIG. 4, which is a circuit block diagram of a leakage current detection circuit according to an embodiment of the present application.

As shown in FIG. 4, the signal output module 14 includes a first switch tube Q1, a second switch tube Q2, a third switch tube Q3, a fourth switch tube Q4 and a first control unit. A first end of the first switch tube Q1 and a first end of the second switch tube Q2 are used for being connected to a power supply, a second end of the first switch tube Q1 is connected to a first end of the auxiliary winding 12 via the detection module 13, a second end of the first switch tube Q1 is also connected to a first end of the fourth switch tube Q4, a second end of the second switch tube Q2 is respectively connected to a second end of the auxiliary winding 12 and a first end of the third switch tube Q3, and a second end of the third switch tube Q3 and a second end of the fourth switch tube Q4 are used for being grounded; the first control unit is respectively connected to control ends of the first switch tube Q1, the second switch tube Q2, the third switch tube Q3 and the fourth switch tube Q4.

The first control unit is used for controlling the on-off states of the first switch tube Q1, the second switch tube Q2, the third switch tube Q3 and the fourth switch tube Q4 so as to output the pulse signal with pulse signals with positive and negative alternations, wherein the on-off state of the first switch tube Q1 is the same as that of the third switch tube Q3, the on-off state of the second switch tube Q2 is the same as that of the fourth switch tube Q4, and the first switch tube Q1 and the second switch tube Q2 are alternately turned on.

Wherein the first control unit is used for outputting a PWM signal so as to control the on-off state of the first switch tube Q1, the second switch tube Q2, the third switch tube Q3 and the fourth switch tube Q4; for example, a first signal PWM1A and a second signal PWM1B are periodically and alternately output, wherein the first signal PWM1A is used for controlling the on-off state of the first switch tube Q1 and the third switch tube Q3, and the second signal PWM1B is used for controlling the on-off state of the second switch tube Q2 and the fourth switch tube Q4, and the on-off state is a guiding on or off state. Referring to FIGS. 2A-2B, the pulse signals with positive and negative alternations include a first signal PWM1A and a second signal PWM1B. The first signal PWM1A corresponds to a positive voltage VCC, and the second signal PWM1B corresponds to a negative voltage-VCC, and by periodically outputting the pulse signals with positive and negative alternations, currents in different directions flow through the auxiliary winding 12, so that the auxiliary winding 12 is in a near-saturation state.

It should be noted that, although the current on the auxiliary winding 12 is changed by periodically outputting the pulse signal, thereby generating an induced magnetic field, generally the VCC voltage is relatively small, for example 5V or 12V, so that the induced electromotive force generated on the auxiliary winding 12 is also small, and the influence on the main winding 11 is negligible.

Specifically, when the first control unit controls the first switch tube Q1 and the third switch tube Q3 to be conductive, the electrical signal output by the power supply flows from the power supply to the detection module 13 via the first switch tube Q1, then from the detection module 13 to the auxiliary winding 12, and finally into the first control unit via the third switch tube Q3. When the first control unit controls the second switch tube Q2 and the fourth switch tube Q4 to be conductive, an electrical signal output from a power supply is passed from the power supply to the auxiliary winding 12 via the second switch tube Q2, and then from the auxiliary winding 12 to the first control unit via the detection module 13. Thus, by alternately controlling the conductive states of the first switch tube Q1 and the second switch tube Q2, pulse signals with positive and negative alternations can be input to the auxiliary winding 12.

As shown in FIG. 4, in some embodiments, the detection module 13 includes a sampled resistor R1, an operational amplifier U1, and a second control unit. A first end of the auxiliary winding 12 is connected to the signal output module 14 via the sampled resistor, two input ends of the operational amplifier U1 are connected to two ends of the sampled resistor, and an output end of the operational amplifier is connected to the second control unit. In this embodiment, the second control unit and the first control unit are the same control module, i.e. CPU in FIG. 4.

In some embodiments, the detection module 13 further includes a filter having a first end connected to the output end of the operational amplifier U1 and a second end connected to the second control unit.

Specifically, since the magnetic core saturation duration of the auxiliary winding 12 is short due to the continuous change of the current direction, a filter is provided after the auxiliary winding 12 to filter out transient spikes generated by the induced current so as to avoid misjudgment by the second control unit.

In some embodiments, the detection module 13 is further used for acquiring leakage current information according to the current signal and the duty ratio of the pulse signal, and detecting the leakage current of the device to be detected. Specifically, since the pulse signals with positive and negative alternations are applied to both ends of the auxiliary winding 12, the current signal measured by the detection module 13 is not equal to an actual leakage current signal, and the actual leakage current signal has a certain proportional relationship with the duty ratio of the applied pulse signal, and therefore a leakage current value can be calculated according to the size of the duty ratio and the measured current signal. Further, a functional relationship between the current signal and the leakage current information is acquired, and the leakage current information is calculated according to the relationship, wherein the relationship can be obtained through calculation, and the functional relationship or graph can also be fitted through specific experimental data.

In some embodiments, the detection module 13 is further used for determining whether the current signal is greater than a preset current, and a leakage current alarm signal is output when the current signal is greater than the preset current. Specifically, according to a detection standard, when an actual leakage current value of the device to be detected is greater than 30 mA, it is indicated that the device to be detected has a leakage current fault; therefore, according to the requirements of a user, if it is only necessary to determine whether a leakage current fault occurs, it can be determined by means of determining whether a measured current signal is greater than a preset current, so as to reduce the calculation load of a processor. Further, the preset current can be customized according to actual requirements of a user; it is also possible to measure an analogue 30 mA current signal on the main winding 11 after the establishment of the leakage current detection circuit 1 is completed, the current signal detected at this time is recorded, and the current signal is used as a preset current.

Specifically, the alarm signal may be a signal lamp, and when the detection module 13 detects a leakage current in the device to be detected, the signal lamp turns on so as to generate the alarm signal.

The first control unit and the second control unit may be the same CPU or two CPUs. It only needs to meet the circuit design requirements described above.

The embodiments of the present application discloses a leakage current detection circuit, wherein the leakage current detection circuit includes a main winding, an auxiliary winding, a detection module and a signal output module, the leakage current detection circuit is used for detecting a leakage current of a device to be detected, wherein the main winding is used for connecting to a leakage current detection end of the device to be detected, the main winding is coupled to the auxiliary winding, the auxiliary winding is respectively connected to the signal output module and the detection module, and the signal output module is used for outputting pulse signals with positive and negative alternations, so that the auxiliary winding is in a preset state, and at this time, if there is a leakage current on the main winding, the leakage current coupled to the auxiliary winding is superimposed with the pulse signals with positive and negative alternations, so that the current signal detected by the detection module is greater than the current signal detected when the pulse signals with positive and negative alternations are not applied, thereby improving the sensitivity of leakage current detection, and eliminating the need for using a detection device with higher sensitivity, and reducing the cost of detection.

Figure 5:
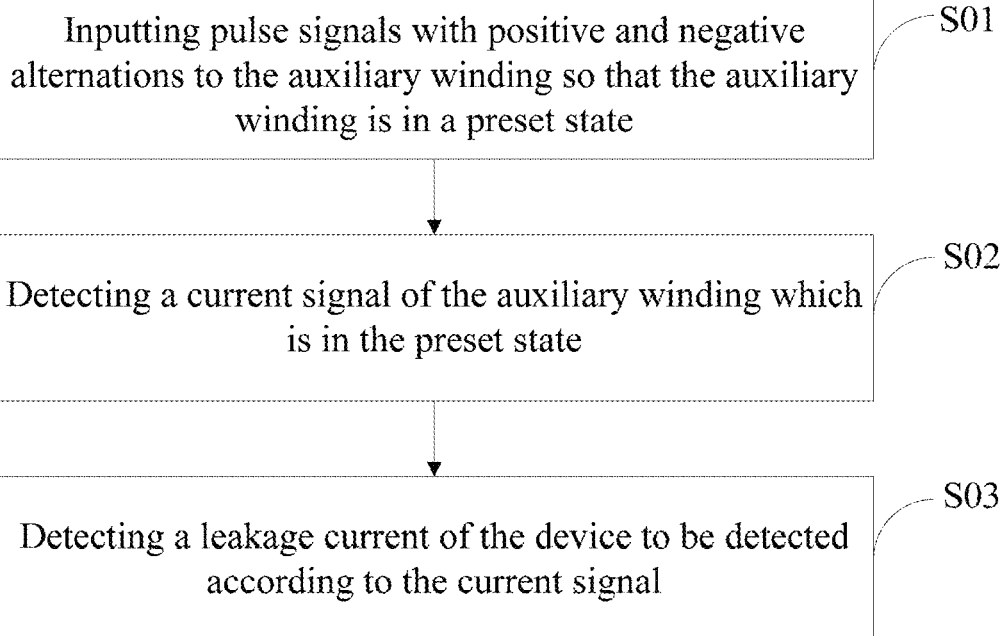
FIG. 5 is a flow chart of a leakage current detection method according to an embodiment of the present application.
Figure 6A:
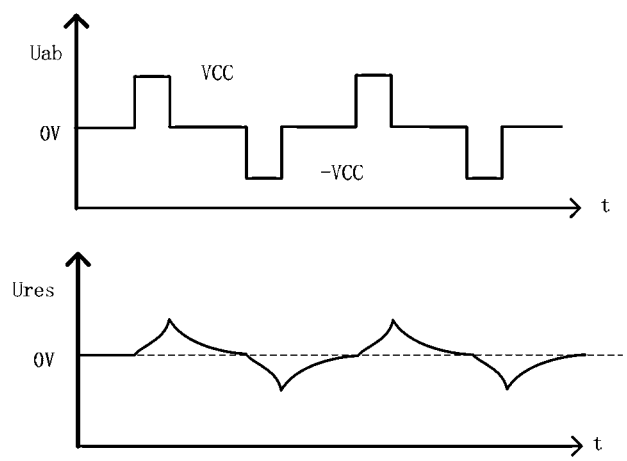
FIGS. 6A-6D are waveform diagrams of current signals corresponding to different duty ratios in a leakage current detection circuit according to an embodiment of the present application.
Figure 6B:
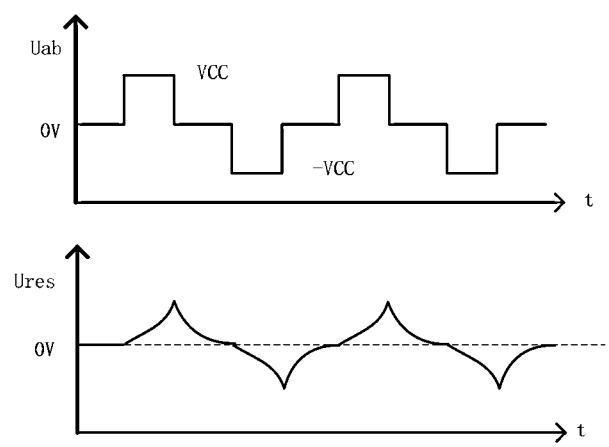
Figure 6C:
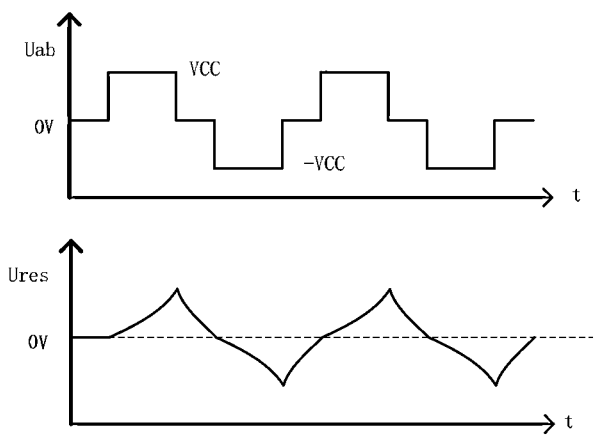
Figure 6D:
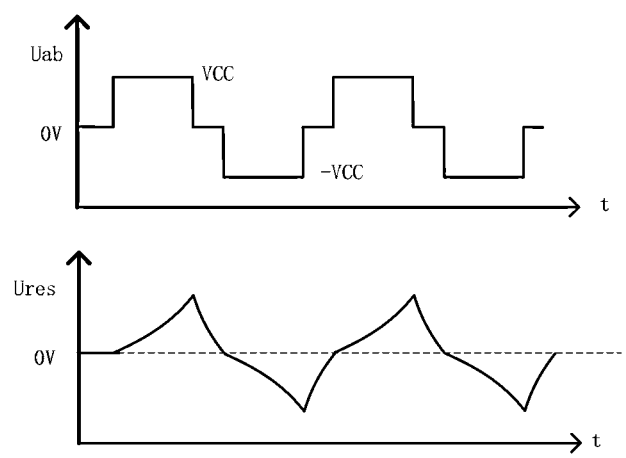

With reference to FIG. 5, which is a flow chart of a leakage current detection method according to an embodiment of the present application, and as shown in FIG. 5, the method is executed by the above-mentioned leakage current detection circuit, which includes the following steps:

S01, inputting the pulse signals with positive and negative alternations to the auxiliary winding so that the auxiliary winding is in a preset state.

wherein the preset state of the auxiliary winding refers to making the auxiliary winding be in a near-saturation state, and the near-saturation state refers to changing the direction of a current in the auxiliary winding by periodically outputting pulse signals with positive and negative alternations so that the auxiliary winding is in a near-saturation state.

The pulse signal includes a duty ratio of the pulse signal. Specifically, parameter information about the auxiliary winding and a magnetic induction intensity variation when the auxiliary winding is in a nearsaturation state are acquired, wherein the parameter information includes a cross-sectional area of a magnetic core of the auxiliary winding and the number of coil turns; then a first duty ratio of the pulse signal is calculated according to the parameter information and the magnetic induction intensity variation, and at this time, the size of the duty ratio of the pulse signal is the calculated first duty ratio D.

Specifically, the expression for calculating the duty ratio is:

$$D = \frac{Ton}{Ts} \quad (1)$$

wherein Ts is a cycle time and Ton is a voltage application time;

the voltage application time is expressed as:

$$\Delta B = U_L \times \frac{Ton}{(Ae \times Ns)} \quad (2)$$

wherein $\Delta B$ is the magnetic induction intensity variation, $U_L$ is the voltage applied to the auxiliary winding, Ton is the voltage application time, Ae is the magnetic core cross-sectional area, and Ns is the number of coil turns of the auxiliary winding;

the cycle time is expressed as:

$$Ts = \frac{1}{f_s} \quad (3)$$

wherein $f_s$ is a switching frequency.

It should be noted that the magnetic flux density variation should be selected in accordance with 1.2-1.5 times the maximum magnetic flux density $B_{max}$ of the magnetic core material. By applying pulse signals with positive and negative alternations to the auxiliary winding, the auxiliary winding is brought to a near-saturation state, thereby improving the accuracy degree of leakage current detection.

The following is a specific first duty ratio calculation process, wherein the maximum saturation magnetic induction intensity $B_{max}$ of the magnetic core is 0.36 T, and if the magnetic induction intensity variation $\Delta B$ of the auxiliary winding in a nearsaturation state takes 1.2 times of the maximum saturation magnetic induction intensity $B_{max}$, then $\Delta B$=0.432 T; the cross-sectional area of the magnetic core Ae=0.0596 cm$^2$, the switching frequency fs is 7 KHz, the number of turns N of the auxiliary winding is 73, and the peak voltage VCC of the pulse signal is 5 V, i.e. UL=5 V; substituting the above data into Equations (1), (2), and (3), the resulting duty ratio D is calculated to be 0.263. That is, the control signal output module outputs a pulse signal with a duty ratio of 0.263, i.e. the auxiliary winding can be in a preset state, i.e. a nearsaturation state.

In some embodiments, the leakage current detection circuit determines the required number of coil turns of the magnetic core material and the auxiliary winding to meet the requirements through the relationship between the duty ratio of a pulse and the number of coil turns of the magnetic core material and the auxiliary winding under the premise that the magnetic induction intensity variation can be determined, thereby selecting the number of coil turns of the magnetic core material and the auxiliary winding with the best performance-price ratio, so as to reduce the circuit design cost.

In another embodiment, the leakage current detection circuit determines that the number of coil turns of the auxiliary winding meets the requirements by determining the relationship between the duty ratio of the pulse and the number of coil turns of the auxiliary winding on the premise that the requirement of the magnetic induction intensity variation and the magnetic core material can be determined, and then selects the number of coil turns of the auxiliary winding with the best cost performance ratio so as to reduce the circuit design cost.

In one embodiment, the first duty ratio may also be determined according to the following method:

inputting a plurality of positive or negative pulse signals of different duty ratios to the auxiliary winding;

detecting a current signal corresponding to each duty ratio;

according to each duty ratio and a corresponding current signal, fitting a curve of the duty ratio and the current signal;

acquiring a size of a duty ratio corresponding to a slope maximum point in a curve of a fitted duty ratio and a current signal, and setting the size of the duty ratio as a first duty ratio; and inputting pulse signals with positive and negative alternations having a first duty ratio as the size of the duty ratio to the auxiliary winding, so that the auxiliary winding is in the preset state.

Specifically, by inputting a plurality of positive or negative pulse signals with different duty ratios to the auxiliary winding, and reading current information corresponding to the auxiliary winding at different duty ratios via the detection module, a plurality of discrete points of a corresponding relationship between the duty ratio and the current information can be acquired, and the more the acquired discrete points are, the closer the fitted curve of the duty ratio and the current information is to an actual detection value, and the more accurate the detection of the leakage current is. As shown in FIGS. 6A-6D, when different duty ratios are input to the auxiliary winding, the effective value of the corresponding current signal is also different (taking a unidirectional pulse signal as an example); generally, as the pulse signal increases, the variation amount of the corresponding current signal gradually increases, and then gradually decreases. Therefore, by acquiring the size of the duty ratio corresponding to the maximum slope point in the curve of the fitted duty ratio and current signal, i.e. acquiring the point where the current signal changes by the maximum amount when the duty ratio changes. That is, when the main winding generates a leakage current, the greater the detected current signal value, the greater the leakage current detection sensitivity. In this manner, the sensitivity of leakage current detection can be improved by applying the pulse signals with positive and negative alternations having a first duty ratio as the size of the duty ratio to the auxiliary winding.

S02, detecting a current signal of the auxiliary winding which is in the preset state.

Wherein a current signal of the auxiliary winding is detected by the detection module, and the current signal includes the direction and magnitude of the current, specifically, by acquiring a current signal flowing out of the auxiliary winding, then amplifying the current signal, filtering the amplified current signal, and finally inputting same to the second control unit. Wherein by amplifying the current signal, the sensitivity of the leakage current detection can be improved; however, the amplified current signal can generate an instantaneous peak, and at this time, by filtering the instantaneous peak, the misjudgment by the second control unit can be reduced.

Specifically, when the auxiliary winding is in the preset state, if a leakage current exists on the main winding, a corresponding induced current will also be generated on the auxiliary winding, resulting in that the current on the auxiliary winding will increase in a forward direction or a reverse direction, and it can be learnt according to the formula:

$$U_L = L \times \frac{d_i}{d_t}$$

wherein $U_L$ is the voltage on the auxiliary winding, L is the inductance, $d_r$ is the current increment on the auxiliary winding, and $d_t$ is the time increment on the auxiliary winding.

When an induced current is generated on the auxiliary winding, the current on the auxiliary winding will sharply increase, and the output voltage on the auxiliary winding will also increase, which is finally detected by the detection module, so as to determine that there is a leakage current on the device to be detected and send out an alarm signal.

S03, detecting a leakage current of the device to be detected according to the current signal.

Specifically, referring to FIG. 2C, the first control unit changes the current direction on the auxiliary winding by controlling the signal output module to periodically output pulse signals with positive and negative alternations, so that the voltage on the auxiliary winding also changes. When no leakage current is generated on the main winding, the signal output module inputs the pulse signals with positive and negative alternations to the auxiliary winding, the detection module detects a current or voltage signal with positive and negative alternations, and the effective value of the positive current is equal to the effective value of the negative current in one period, and at this time, the detection module collects that the effective value of the current in one period is zero.

Referring to FIG. 3, when a leakage current exists in the leakage current detection circuit, the generated induced current is superimposed with the pulse signals with positive and negative alternations; current information about the auxiliary winding detected by the detection module will shift to one side; when the leakage current is positive, the positive voltage or positive current collected by the detection module increases, the negative voltage or negative current decreases, and the effective value of the detected current or voltage within one period increases, so that the detection of the leakage current can be realized, and the sensitivity of leakage current detection is improved; furthermore, it is not necessary to use a high-cost leakage current sensor, which reduces the cost of leakage current detection.

Specifically, in one embodiment, according to the current signal, the method for detecting the leakage current of the device to be detected may be: determining whether the current signal is greater than the preset current, and outputting a leakage current alarm signal when the current signal is greater than the preset current. Specifically, according to some standards, when an actual leakage current value of the device to be detected is greater than 30 mA, it is indicated that the device to be detected has a leakage current fault; therefore, according to the requirements of a user, if it is only necessary to detect whether a leakage current fault occurs, it can be detect by determining whether a measured current signal is greater than a preset current, so as to reduce the calculation load of a processor. Further, the preset current can be customized according to actual requirements of a user; it is also possible to measure an analogue 30 mA current signal on the main winding measurement after the establishment of the leakage current detection circuit is completed, the current signal detected at this time is recorded, and the current signal is used as a preset current. In another embodiment, according to leakage current of the device to be detected according to the current signal may be detecting the leakage current of the device to be detected current of the device to be detected according to the current signal and the duty ratio of the pulse signal. Specifically, since the pulse signals with positive and negative alternations are applied to both ends of the auxiliary winding, the current signal measured by the detection module is not equal to an actual leakage current signal, and the actual leakage current signal has a certain proportional relationship with the duty ratio of the applied pulse signal, and therefore a leakage current value can be calculated according to the size of the duty ratio and the measured current signal. Further, a functional relationship between the current signal and the leakage current information is acquired, and the leakage current information is calculated according to the relationship, wherein the relationship can be obtained through calculation, and the functional relationship or graph can also be fitted through specific experimental data.

In some embodiments, the leakage current detection method further includes range extension. Since the transient current spikes generated when the auxiliary winding is saturated are easily filtered out, the measurement range becomes small, so the measurement output of the auxiliary winding is close to positive and negative balance by adjusting the size of the duty ratio in reverse, so the influence of magnetic core saturation on the measurement result is reduced, the detection precision is improved and the measurement range is extended.

Specifically, firstly, determining whether the current signal is greater than a preset threshold value; when the current signal is greater than the preset threshold value, direction information about the current signal is acquired; then according to the direction information, the size of the duty ratio of the pulse signal is reversely adjusted; then the current signal of the auxiliary winding is re-acquired; and according to the re-acquired current signal and adjusted size of the duty ratio, the leakage current information is acquired so as to detect the leakage current of the device to be detected. In this way, the influence of the saturation of the magnetic core on the measurement results can be reduced, while the detection precision can be improved and the measurement range can be extended.

Wherein the reversely adjusting the size of the duty ratio of the pulse signal includes reducing the duty ratio of the positive pulse signal and keeping the duty ratio of the negative pulse signal constant when the current signal is detected to be positive, and reducing the duty ratio of the negative pulse signal and keeping the duty ratio of the positive pulse signal constant when the current signal is detected to be negative. As shown in FIGS. 2A-2C, when pulse signals with positive and negative alternations are input to the auxiliary winding and the detected current information does not exceed a preset value, the duty ratio of the positive pulse signal (PWM1A) is equal or nearly equal in the size of the duty ratio of the negative pulse information (PWM1B).

Figure 7A:
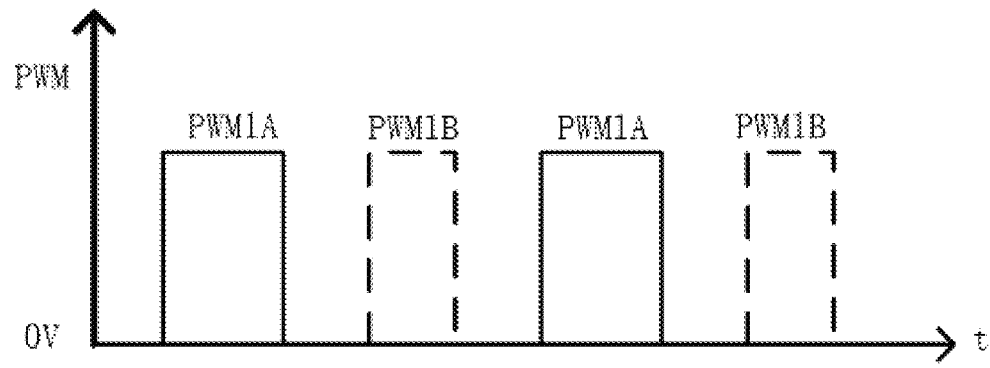
FIGS. 7A-7C are graphs of measured output values of auxiliary windings in a leakage current detection circuit according to an embodiment of the present application.
Figure 7B:
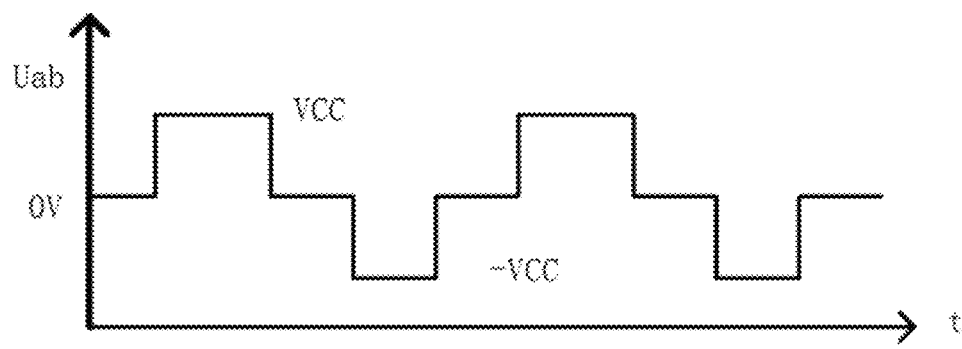
Figure 7C:
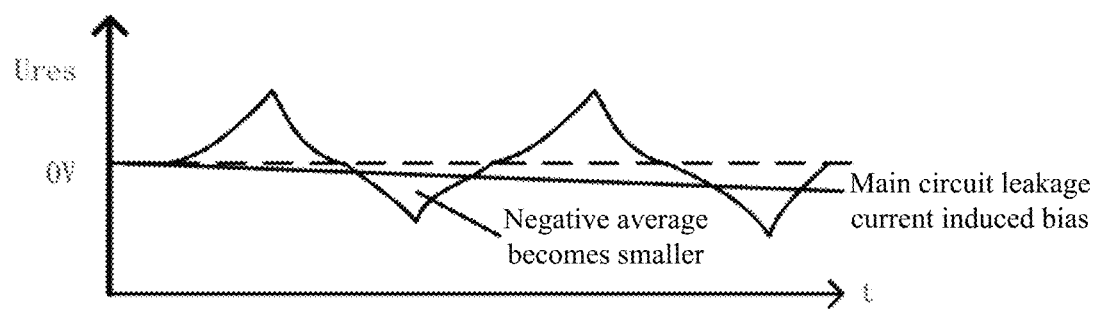

With reference to FIGS. 7A-7C, FIGS. 7A-7C are diagrams for adjusting a measurement output value of an auxiliary winding in a leakage current detection circuit according to an embodiment of the present application; as shown in FIGS. 7A-7C, when a current signal is detected to exceed a preset threshold value and the current signal is negative, the duty ratio of a positive pulse signal (PWM1A) is kept unchanged, and the duty ratio of a negative pulse signal (PWM1B) is reduced, so that the leakage current and the positive-negative alternating pulse signal make the measurement output of the auxiliary winding approach a positive-negative balance, thereby reducing the influence of magnetic core saturation on a measurement result, which can improve the detection accuracy and realize the extension of a measurement range.

Specifically, in response to the current signal detected to be greater than a first preset threshold value and less than a second preset threshold value, according to the direction information, reversely adjusting the size of the duty ratio of the pulse signal to a second duty ratio; in response to the current signal detected to be greater than a second preset threshold value, according to the direction information, reversely adjusting the size of the duty ratio of the pulse signal to a third duty ratio; wherein the first preset threshold value is less than the second preset threshold value, and the second duty ratio is greater than the third duty ratio. In other words, the current signal and the duty ratio of the pulse signal are in an inverse proportion relationship, and when the current signal is greater, the duty ratio of the pulse signal is smaller. It should be understood that the second preset threshold value, the third preset threshold value, the second duty ratio, and the third duty ratio can be designed according to the actual requirements of a user, or according to the specific leakage current detection circuit built, through specific experimental data or the results of simulation and simulation; for example, various leakage currents are simulated input on the main winding, and the duty ratio of a pulse signal is adjusted so as to obtain multiple groups of experimental data, and corresponding values of the second preset threshold value, the third preset threshold value, the second duty ratio, and the third duty ratio are set by analyzing the experimental data. That is, after learning the technical solution provided in the present application, a person skilled in the art would have been able to obtain the determination of the above-mentioned numerical values by way of a limited number of trials; that is to say, the specific set values of the second preset threshold value, the third preset threshold value, the second duty ratio, and the third duty ratio are not the focus of the present application. In addition, the calculation of the corresponding actual leakage current can also be obtained by searching a corresponding table or a corresponding relationship obtained by specific experimental data.

It should be noted that the above-mentioned embodiment merely lists a second preset threshold value and a third preset threshold value, and a user can set a fourth preset threshold value and a fifth preset threshold value, etc. according to actual requirements so as to adjust a corresponding size of the duty ratio.

In some embodiments, the leakage current detection method further includes self-testing for the leakage current detection circuit.

Specifically, the magnitude of a positive or negative size of the duty ratio in the pulse signal with positive and negative alternations is adjusted so that the size of the duty ratio of the positive pulse signal is different from that of the negative pulse signal, and a current signal of the auxiliary winding is detected in real time, and then a self-test of the leakage current detection circuit is realized according to the magnitude of the current signal.

Specifically, a external current input source is connected to the leakage current detection circuit so that there is a first current on the circuit, wherein the first current is at least greater than 30 milliamps. A first output value on the auxiliary winding is acquired and recorded at this moment, the external current input source is disconnected so that the first current in the leakage current detection circuit becomes zero, and a second output value on the auxiliary winding is acquired. Then a duty ratio of the pulse signals with positive and negative alternations is acquired, the duty ratio of one of the pulse signals are adjusted so that the difference between the first output value and the second output value is within a preset range, and an adjusted duty ratio is acquired, wherein the difference between the second output value and the first output value may be between 0-0.1. Finally, the adjusted duty ratio and the duty ratio of the further pulse signal are set to a self-test initial pulse width. When the leakage current of the main winding is zero, the pulse width of the first signal PWM1A or the second signal PWM1B is reduced, so that the positive and negative excitation of the magnetic core are not equal, thereby artificially generating a positive and negative unbalanced current in the auxiliary winding, and actively triggering a leakage current fault so as to realize self-testing of a device.

The present application provides a leakage current detection method, which is applied to a leakage current detection circuit, wherein according to the method, the auxiliary winding is made to be in a preset state by inputting a pulse signal with pulse signals with positive and negative alternations to the auxiliary winding, then a current signal of the auxiliary winding is detected when the auxiliary winding is in the preset state, and finally, the leakage current of a device to be detected is detected according to the current signal, and the leakage current coupled to the auxiliary winding is enabled to be superimposed with the pulse signal with pulse signals with positive and negative alternations when there is a leakage current on the main winding by enabling the auxiliary winding to be in a preset state. Thus, the sensitivity of leakage current detection is improved, and the detection cost is reduced without using a detection device with higher sensitivity.

It should be noted that in the above-mentioned various embodiments, there is not necessarily a certain order between the above-mentioned various steps, and a person of ordinary skill in the art would have been able to understand according to the description of the embodiments of the present application that in different embodiments, the above-mentioned various steps can be performed in a different order, i.e. can be performed in parallel, can be performed in exchange, etc.

Embodiments of the present application also provide a leakage current detector comprising the leakage current detection circuit of any of the above, and/or detecting a leakage current using the leakage current detection method of any of the above, wherein the leakage current detector changes the direction of a current through a signal output module, thereby increasing the sensitivity of the leakage current detector and reducing the cost of the leakage current detector.

Finally, it should be noted that: the above-mentioned embodiments are merely illustrative of the technical solution of the present application, and do not limit same; under the idea of the present application, the technical features in the above embodiments or in different embodiments may also be combined, the steps may be implemented in any order, and there are many other variations of the different aspects of the present application as described above, which are not provided in detail for the sake of brevity; although the present application has been described in detail with reference to the foregoing embodiments, those skilled in the art will appreciate that: the technical solutions disclosed in the above-mentioned embodiments can still be amended, or some of the technical features thereof can be replaced by equivalents; however, these modifications or substitutions do not bring the essence of the corresponding technical solutions out of the scope of the technical solutions of the various embodiments of the present application.

What is claimed is:

1. A leakage current detection circuit for detecting a leakage current of a device to be detected, wherein the leakage current detection circuit comprises a main winding, an auxiliary winding, a detection module, and a signal output module;
   wherein the main winding is used for being connected to a leakage current detection end of the device to be detected, the main winding is coupled to the auxiliary winding, and the auxiliary winding is respectively connected to the signal output module and the detection module;
   the signal output module is used for outputting pulse signals with positive and negative alternations so that the auxiliary winding is in a near-saturation state; and
   the detection module is used for detecting a current signal of the auxiliary winding which is in the near-saturation state, and detecting a leakage current of the device to be detected according to the current signal;
   wherein the step of detecting a leakage current of the device to be detected according to the current signal comprises:
   determining whether the current signal is greater than a preset threshold value;

in response to the current signal greater than the preset threshold value, acquiring direction information about the current signal,
reversely adjusting a size of a duty ratio of the pulse signal according to the direction information,
reacquiring a current signal of the auxiliary winding; and
obtaining the leakage current information according to the reacquired current signal and the adjusted size of the duty ratio, so that the leakage current of the device to be detected is detected.

2. The leakage current detection circuit according to claim 1, wherein the signal output module comprises a first switch tube, a second switch tube, a third switch tube, a fourth switch tube and a first control unit;
wherein a first end of the first switch tube and a first end of the second switch tube are used for connecting a power supply, a second end of the first switch tube is connected to a first end of the auxiliary winding via the detection module, a second end of the first switch tube is also connected to a first end of the fourth switch tube, a second end of the second switch tube is respectively connected to a second end of the auxiliary winding and a first end of the third switch tube, a second end of the third switch tube and a second end of the fourth switch tube are used for grounding, and the first control unit is respectively connected to control ends of the first switch tube, the second switch tube, the third switch tube, and the fourth switch tube; and
wherein the first control unit is used for controlling the on-off states of the first switch tube, the second switch tube, the third switch tube, and the fourth switch tube so as to output the pulse signals with positive and negative alternations, wherein the on-off state of the first switch tube is the same as that of the third switch tube, the on-off state of the second switch tube is the same as that of the fourth switch tube, and the first switch tube and the second switch tube are alternately conductive.

3. The leakage current detection circuit according to claim 1, wherein the detection module comprises a sampled resistor, an operational amplifier, and a second control unit;
wherein a first end of the auxiliary winding is connected to the signal output module via the sampled resistor, two input ends of the operational amplifier are connected to two ends of the sampled resistor, and an output end of the operational amplifier is connected to the second control unit.

4. The leakage current detection circuit according to claim 1, wherein the detection module is further used for acquiring leakage current information according to the current signal and the duty ratio of the pulse signal, so that the leakage current of the device to be detected is detected or
the detection module is also used for determining whether the current signal is greater than a preset current, and in response to the current signal greater than the preset current, outputting a leakage current alarm signal.

5. A leakage current detection method applied to the leakage current detection circuit according to claim 4, wherein the method comprises:
inputting pulse signals with positive and negative alternations to the auxiliary winding so that the auxiliary winding is in a near-saturation state;
detecting a current signal of the auxiliary winding which is in the near-saturation state; and
detecting a leakage current of the device to be detected according to the current signal;
wherein the step of detecting a leakage current of the device to be detected comprises:
determining whether the current signal is greater than a preset threshold value;
in response to the current signal greater than the preset threshold value, acquiring direction information about the current signal,
reversely adjusting the size of the duty ratio of the pulse signal according to the direction information and reacquiring a current signal of the auxiliary winding; and
obtaining the leakage current information according to the reacquired current signal and the adjusted size of the duty ratio, so that the leakage current of the device to be detected is detected.

6. The leakage current detection method according to claim 5, wherein the step of inputting the pulse signals with positive and negative alternations to the auxiliary winding so that the auxiliary winding is in a near-saturation state comprises:
acquiring parameter information about the auxiliary winding, wherein the parameter information comprises a cross-sectional area of a magnetic core of the auxiliary winding and the number of coil turns;
acquiring a magnetic induction intensity variation of the the auxiliary winding which is in a near-saturation state;
calculating a first duty ratio of the pulse signal according to the parameter information and the magnetic induction intensity variation amount; and
inputting the pulse signals with positive and negative alternations to the auxiliary winding so that the auxiliary winding is in the near-saturation state, wherein the size of the duty ratio of the pulse signal is the calculated first duty ratio.

7. The leakage current detection method according to claim 5, wherein the step of reversely adjusting the size of the duty ratio of the pulse signal according to the direction information comprises:
in response to the current signal detected to be positive, reducing the duty ratio of the positive pulse signal, and keeping the duty ratio of the negative pulse signal unchanged; and
in response to the current signal detected to be negative, reducing the duty ratio of the negative going pulse signal, and keeping the duty ratio of the positive pulse signal unchanged.

8. The leakage current detection method according to claim 5, wherein the method further comprises:
in response to the current signal detected to be greater than a first preset threshold value and less than a second preset threshold value, according to the direction information, reversely adjusting the size of the duty ratio of the pulse signal to a second duty ratio;
in response to the current signal detected to be greater than the second preset threshold value, according to the direction information, reversely adjusting the size of the duty ratio of the pulse signal to a third duty ratio;
wherein the first preset threshold value is less than the second preset threshold value, and the second duty ratio is greater than the third duty ratio.

9. The leakage current detection method according to claim 5, wherein after the step of inputting the pulse signals with positive and negative alternations to the auxiliary winding so that the auxiliary winding is in a near-saturation state, the method further comprises:

adjusting the magnitude of a positive or negative size of the duty ratio in the pulse signals with positive and negative alternations, so that the size of the duty ratio of the positive pulse signal and the negative pulse signal is different, and detecting a current signal of the auxiliary winding in real time; and self-testing the leakage current detection circuit according to the magnitude of the current signal.

10. A leakage current detector, wherein the leakage current detector comprises the leakage current detection circuit according to claim 1.

11. A leakage current detector, wherein the leakage current detector comprises the leakage current detection circuit according to claim 2.

12. A leakage current detector, wherein the leakage current detector comprises the leakage current detection circuit according to claim 3.

13. A leakage current detector, wherein the leakage current detector comprises the leakage current detection circuit according to claim 4.

* * * * *